United States Patent
O'Connor et al.

(10) Patent No.: US 7,132,313 B2
(45) Date of Patent: Nov. 7, 2006

(54) DIAMOND HEAT SPREADING AND COOLING TECHNIQUE FOR INTEGRATED CIRCUITS

(75) Inventors: Michael O'Connor, Cupertino, CA (US); Kevin J. Haley, San Jose, CA (US); Biswajit Sur, San Jose, CA (US)

(73) Assignee: Intel Corporation, Santa Clara, CA (US)

( * ) Notice: Subject to any disclaimer, the term of this patent is extended or adjusted under 35 U.S.C. 154(b) by 88 days.

(21) Appl. No.: 10/721,722

(22) Filed: Nov. 25, 2003

(65) Prior Publication Data

US 2004/0104014 A1  Jun. 3, 2004

Related U.S. Application Data

(62) Division of application No. 09/828,617, filed on Apr. 6, 2001, now Pat. No. 6,667,548.

(51) Int. Cl.
*H01L 21/50* (2006.01)
*H01L 21/00* (2006.01)

(52) U.S. Cl. .................... 438/122; 438/108; 438/105

(58) Field of Classification Search ............ 438/122, 438/121, 123, 118, 125, 108, 105
See application file for complete search history.

(56) References Cited

U.S. PATENT DOCUMENTS

| | | | |
|---|---|---|---|
| 3,859,180 A | 1/1975 | Hasty | 204/16 |
| 4,430,190 A | 2/1984 | Eilers et al. | 204/298 |
| 4,914,551 A * | 4/1990 | Anschel et al. | 361/714 |
| 4,925,701 A | 5/1990 | Jansen et al. | 427/38 |
| 5,029,322 A | 7/1991 | Einzinger et al. | 357/41 |
| 5,227,662 A | 7/1993 | Ohno et al. | 257/676 |
| 5,272,375 A | 12/1993 | Belopolsky | 257/717 |
| 5,379,186 A | 1/1995 | Gold et al. | 361/706 |
| 5,569,620 A * | 10/1996 | Linn et al. | 438/406 |
| 5,674,758 A | 10/1997 | McCarthy | 437/21 |
| 5,854,507 A | 12/1998 | Miremadi et al. | 257/686 |
| 5,939,781 A | 8/1999 | Lacap | 257/698 |
| 5,955,781 A | 9/1999 | Joshi et al. | 257/712 |
| 6,242,778 B1 | 6/2001 | Marmillion et al. | 257/347 |
| 6,255,899 B1 * | 7/2001 | Bertin et al. | 327/564 |
| 6,288,900 B1 | 9/2001 | Johnson et al. | 361/705 |
| 6,376,984 B1 | 4/2002 | Fernandez et al. | 313/530 |
| 6,411,484 B1 | 6/2002 | Tihanyi et al. | 361/103 |
| 2002/0130407 A1 * | 9/2002 | Dahl et al. | 257/712 |

OTHER PUBLICATIONS

T. Tachikawa, "Assembly and Packaging", ULSI Technology, (McGraw Hill, New York, 1986, pp. 530-586.*

* cited by examiner

*Primary Examiner*—Michael Trinh
(74) *Attorney, Agent, or Firm*—Schwegman, Lundberg, Woessner & Kluth, P.A.

(57) ABSTRACT

A semiconductor chip is shown containing an integral heat spreading layer that more effectively transmits heat from the die to ambient as a result of spreading the heat out on the die over a larger cross sectional area. Local hot spots are minimized which allows the semiconductor chip to operate at a higher frequency for a given upper threshold temperature. Also shown is a method of manufacturing such a semiconductor chip, and the associated method of cooling a semiconductor chip.

20 Claims, 7 Drawing Sheets

DEGREES C

DEGREES C

DIAMOND HEAT SPREADING AND COOLING TECHNIQUE FOR INTEGRATED CIRCUITS

This application is a divisional of U.S. patent application Ser. No. 09/828,617, filed Apr. 6, 2001 U.S. Pat. No. 6,667,548, which is incorporated herein by reference.

TECHNICAL FIELD OF THE INVENTION

The present invention relates generally to the field of electronic devices and, in particular, the present invention relates to thermal management of electronic devices.

BACKGROUND

Integrated circuits (IC's) are typically assembled into packages by physically and electrically coupling them to a substrate made of organic or ceramic material. One or more IC packages can be physically and electrically coupled to a printed circuit board (PCB) to form an "electronic assembly". The "electronic assembly" can be part of an "electronic system". An "electronic system" is broadly defined herein as any product comprising an "electronic assembly". Examples of electronic systems include computers (e.g., desktop, laptop, hand-held, server, etc.), wireless communications devices (e.g., cellular phones, cordless phones, pagers, etc.), computer-related peripherals (e.g., printers, scanners, monitors, etc.), entertainment devices (e.g., televisions, radios, stereos, tape and compact disc players, video cassette recorders, MP3 (Motion Picture Experts Group, Audio Layer 3) players, etc.), and the like.

In the field of electronic systems there is an incessant competitive pressure among manufacturers to drive the performance of their equipment up while driving down production costs. This is particularly true regarding forming electronic devices such as transistors in IC's, where each new generation of IC must provide increased performance, particularly in terms of an increased number of devices and higher clock frequencies, while generally being smaller or more compact in size. As the density and clock frequency of IC's increase, they accordingly generate a greater amount of heat. However, the performance and reliability of IC's are known to diminish as the temperature to which they are subjected increases, so it becomes increasingly important to adequately dissipate heat from IC environments.

An IC is fabricated on a substrate that may comprise a number of metal layers selectively patterned to provide metal interconnect lines (referred to herein as "traces"), and one or more electronic devices attached in or on one or more surfaces of the substrate. The electronic device or devices are functionally connected to other elements of an electronic system through a hierarchy of electrically conductive paths that include the substrate traces. The substrate traces typically carry signals that are transmitted between the electronic devices, such as transistors, of the IC. Some IC's have a relatively large number of input/output (I/O) terminals (also called "lands"), as well as a large number of power and ground terminals or lands.

As the internal circuitry of IC's, such as processors, operates at higher and higher clock frequencies, and as IC's operate at higher and higher power levels, the amount of heat generated by such IC's can increase their operating temperature to unacceptable levels. Thermal management of IC's refers to the ability to keep temperature-sensitive elements in an IC within a prescribed operating temperature. Thermal management has evolved to address the increased temperatures created within such electronic devices as a result of increased processing speed/power of the electronic devices.

With the advent of high performance processors, electronic devices have required more innovative thermal management. For example, in the last several years processing speeds of computer systems have climbed from 25 MHZ to over 1000 MHZ. Each of these increases in processing speed and power generally carry with it a "cost" of increased heat that must be dissipated. Corresponding improvements in thermal management such as improved heat sinks or heat pipes have accompanied such technological improvements. Further improvements in thermal management are needed to keep pace with ever increasing processor speeds and the desire to reduce manufacturing costs.

BRIEF DESCRIPTION OF THE DRAWINGS

FIG. 4 is a magnified view of the first embodiment in FIG. 3a.

DETAILED DESCRIPTION

Figure 1:
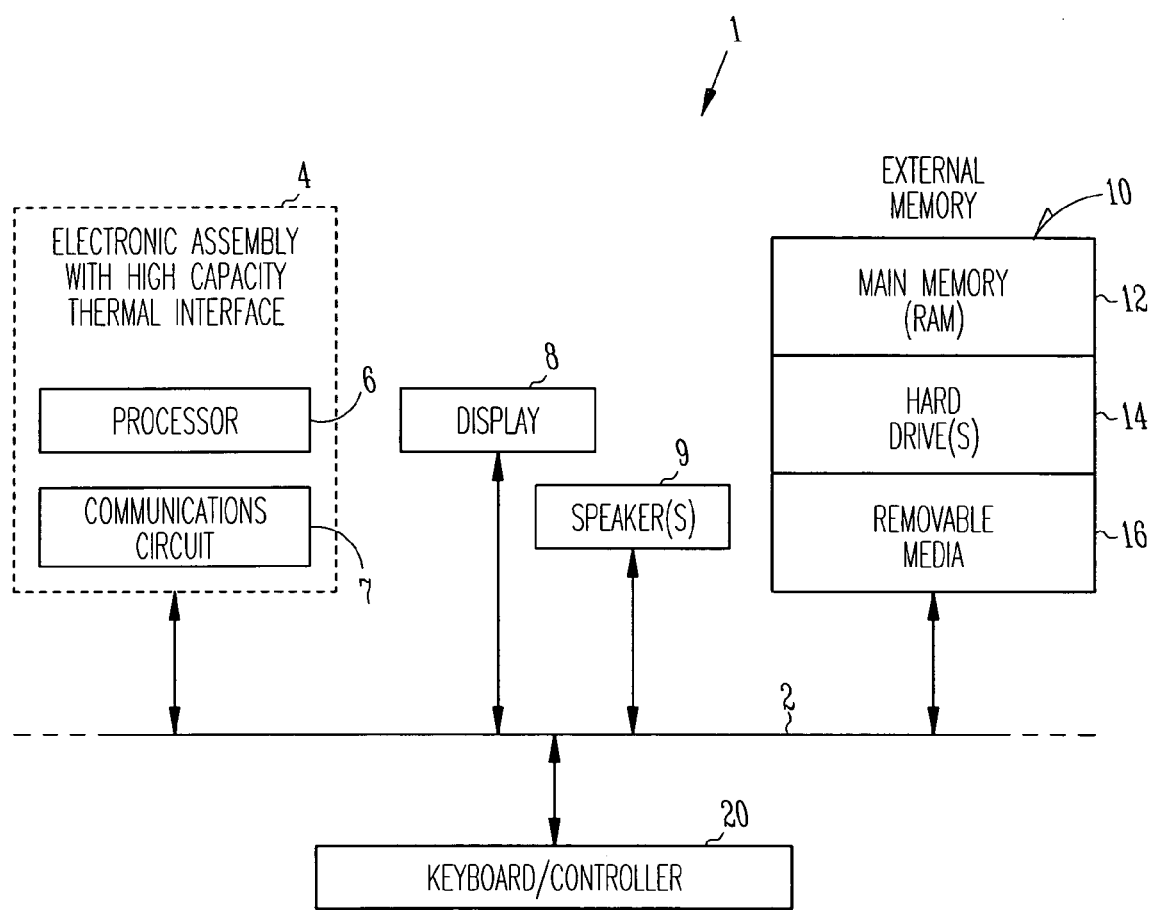
FIG. 1 is a block diagram of an electronic system incorporating at least one electronic assembly with a high capacity thermal interface in accordance with one embodiment of the invention.

In the following detailed description of the invention reference is made to the accompanying drawings which form a part hereof, and in which are shown, by way of illustration, specific embodiments in which the invention may be practiced.

In the drawings, like numerals describe substantially similar components throughout the several views. These embodiments are described in sufficient detail to enable those skilled in the art to practice the invention. Other embodiments may be utilized, and structural, logical, and electrical changes may be made, without departing from the scope of the present invention. The following detailed description is, therefore, not to be taken in a limiting sense, and the scope of the present invention is defined only by the appended claims.

The term "active side" as used in this description is defined as the conventional horizontal, large plane or surface of a chip or die where electrical devices have typically been fabricated, regardless of the orientation of the chip or die. The term "back side" as used in this description is defined as a conventional horizontal, large plane or surface of a chip or die that does not contain any active devices on it's surface. The term "vertical" refers to a direction perpendicular to the horizontal as defined above. Prepositions, such as "on", "higher", "lower", "above" and "below" are defined with respect to the conventional plane or surface being on the active side of the chip or die, regardless of the orientation of the chip or die.

The present invention provides a solution to thermal dissipation problems that are associated with prior art integrated circuits that have high circuit density and that operate at high clock speeds and high power levels, by employing a high capacity thermal material as a heat spreading layer that is integral with the integrated circuit die. Various embodiments are illustrated and described herein.

FIG. 1 is a block diagram of an electronic system 1 incorporating at least one electronic assembly 4 with a high capacity heat spreading layer in accordance with one embodiment of the invention. Electronic system 1 is merely one example of an electronic system in which the present invention can be used. In this example, electronic system 1 comprises a data processing system that includes a system bus 2 to couple the various components of the system. System bus 2 provides communications links among the various components of the electronic system 1 and can be implemented as a single bus, as a combination of busses, or in any other suitable manner.

Electronic assembly 4 is coupled to system bus 2. Electronic assembly 4 can include any circuit or combination of circuits. In one embodiment, electronic assembly 4 includes a processor 6 which can be of any type. As used herein, "processor" means any type of computational circuit, such as but not limited to a microprocessor, a microcontroller, a complex instruction set computing (CISC) microprocessor, a reduced instruction set computing (RISC) microprocessor, a very long instruction word (VLIW) microprocessor, a graphics processor, a digital signal processor (DSP), or any other type of processor or processing circuit.

Other types of circuits that can be included in electronic assembly 4 are a custom circuit, an application-specific integrated circuit (ASIC), or the like, such as, for example, one or more circuits (such as a communications circuit 7) for use in wireless devices like cellular telephones, pagers, portable computers, two-way radios, and similar electronic systems. The IC can perform any other type of function.

Electronic system 1 can also include an external memory 10, which in turn can include one or more memory elements suitable to the particular application, such as a main memory 12 in the form of random access memory (RAM), one or more hard drives 14, and/or one or more drives that handle removable media 16 such as floppy diskettes, compact disks (CDS), digital video disk (DVD), and the like.

Electronic system 1 can also include a display device 8, one or more speakers 9, and a keyboard and/or controller 20, which can include a mouse, trackball, game controller, voice-recognition device, or any other device that permits a system user to input information into and receive information from the electronic system 1.

Figure 2:
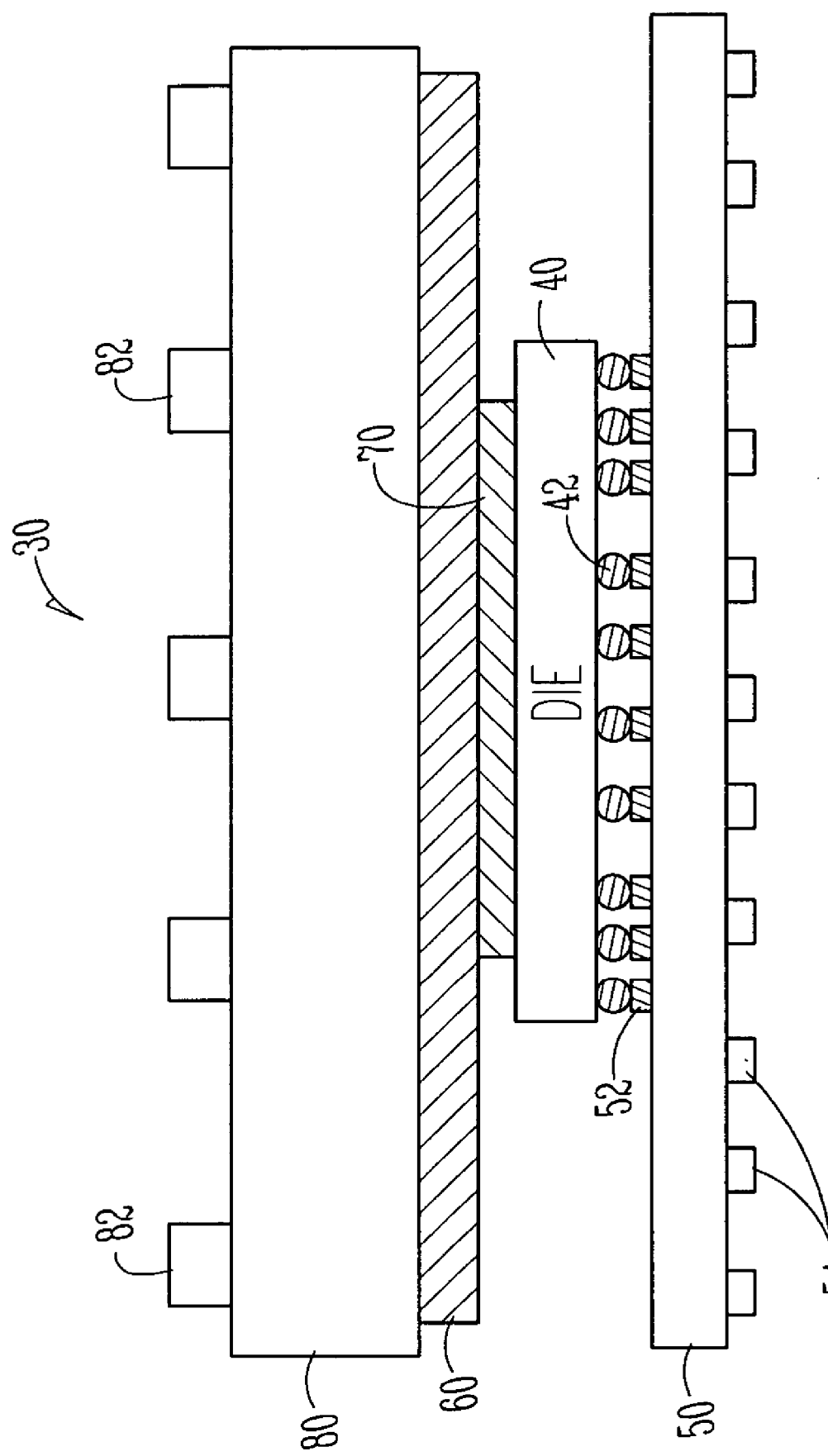
FIG. 2 illustrates a cross-sectional representation of a prior art IC package.

FIG. 2 illustrates a cross-sectional representation of a common configuration IC package 30. IC package 30 represents a typical structure that includes an IC die 40 mounted in "flip-chip" orientation with its active side facing downward to couple with lands 52 on the upper surface of a board 50 through solder balls or bumps 42. Board 50 can be a one-layer board or a multi-layer board, and it can include additional lands 54 on its opposite surface for mating with additional packaging structure (not shown).

Die 40 generates its heat from internal structure, including wiring traces, that is located near its active side; however, a significant portion of the heat is dissipated through its back side. Heat that is concentrated within die 40 is dissipated to a large surface that is in contact with die 40 in the form of an external heat spreader 60 that is typically formed of metal such as copper or aluminum. To improve the thermal conductivity between die 40 and the external heat spreader 60, a thermal interface material 70 is often provided between die 40 and external heat spreader 60. The thermal interface material 70 may include a thermal gel or grease containing metal particles, or in another embodiment, it may include solder.

To further dissipate heat from external heat spreader 60, a heat sink 80 optionally having heat fins 82 is often coupled to external heat spreader 60. Heat sink 80 dissipates heat into the ambient environment.

An increase in the transistor junction temperature $T_j$ of an electronic device on the IC can adversely affect the operating lives of the device. Transistor junction temperature is a function of three factors: junction-to-ambient thermal resistance, power dissipation, and ambient temperature. $T_j$ can be expressed by Equation 1:

$$T_j = (\_ja \times P_d) + T_a \quad \text{(Equation 1)}$$

wherein $T_j$=transistor junction temperature (in degrees C.);

_ja=the junction-to-ambient thermal resistance (in degrees C./watt);

$P_d$=power dissipation at $T_j$ (in watts); and $T_a$=ambient temperature (in degrees C.).

The junction-to-ambient thermal resistance _ja can be represented by Equation 2:

$$\_ja = \_jc + \_cs + \_sa \quad \text{(Equation 2)}$$

wherein _jc=the junction-to-package case thermal resistance (in degrees C./watt);

_cs=the case-to-sink thermal resistance (in degrees C./watt); and

_sa=the sink-to-ambient thermal resistance (in degrees C./watt);

In the foregoing definitions, the pertinent location of the case is the top center of the IC package. The pertinent location of the sink can be the geometric center of the heat sink.

The IC package 30 of FIG. 2 limits the capability of meeting the thermal-dissipating requirements of today's high performance electronic assemblies, as expressed in terms of the junction-to-ambient thermal resistance _ja.

Figure 7A:
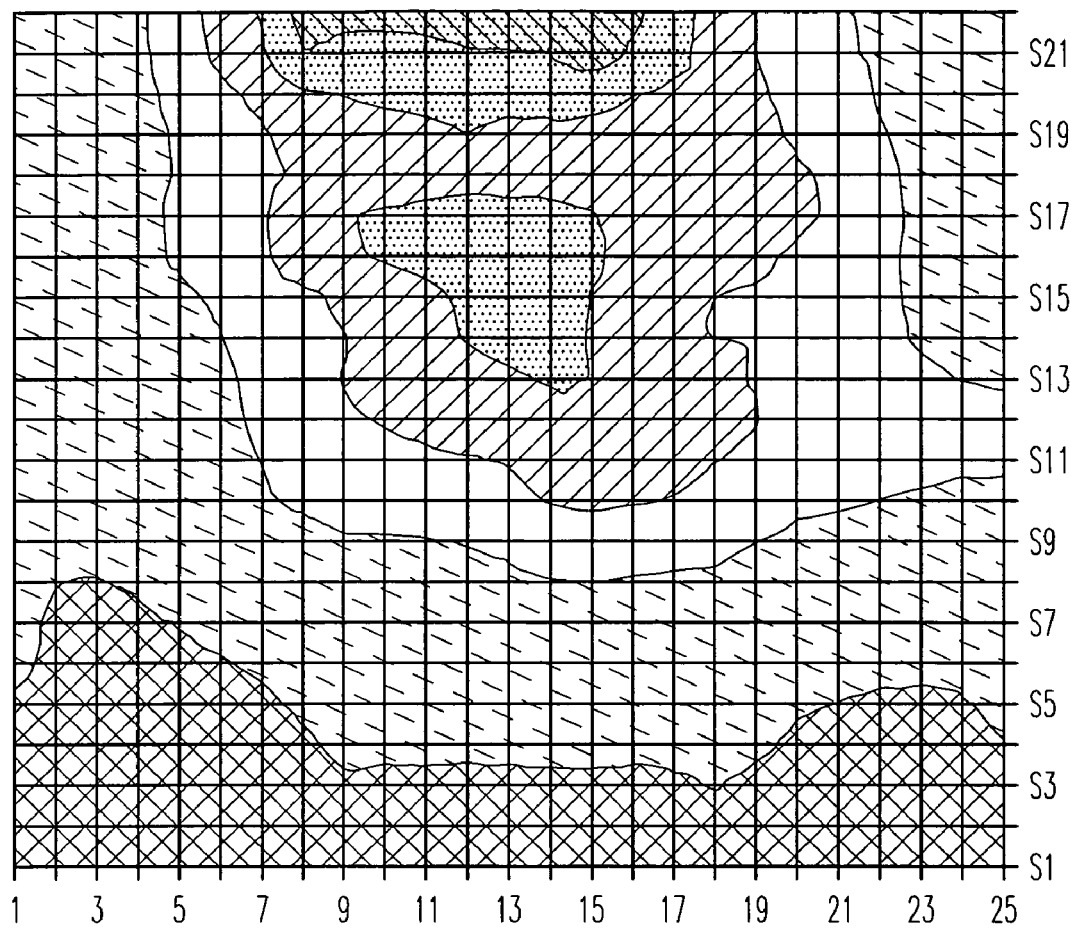
FIG. 7a is an experimental data thermal map of a prior art semiconductor chip.
Figure 7A:
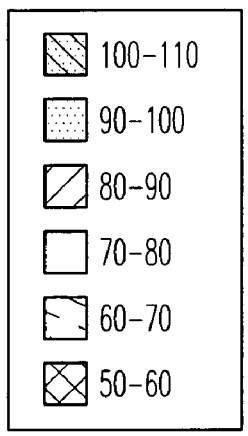

The present invention reduces the transistor junction temperature $T_j$ by reducing the effective junction-to-package case thermal resistance _jc. As shown in FIG. 7a, processor assemblies have a very non-uniform power map or heat flux variation across the surfaces of the die. It is the temperature of the highest flux area(s) that typically must be maintained at or below a specified value. While the silicon die provides some lateral heat spreading, it is insufficient to appreciably reduce the peak temperature(s).

If existing thermal dissipation structure is incapable of dissipating sufficient heat to maintain the die peak temperature below a specified value, the performance of the electronic assembly must be throttled back by reverting to a temperature-dependent processor power control process. Otherwise, the electronic assembly could malfunction or experience a catastrophic failure. Thus, with increased heat dissipation requirements for electronic assemblies, it has become necessary to look towards new techniques and materials for thermal management.

Figure 3A:
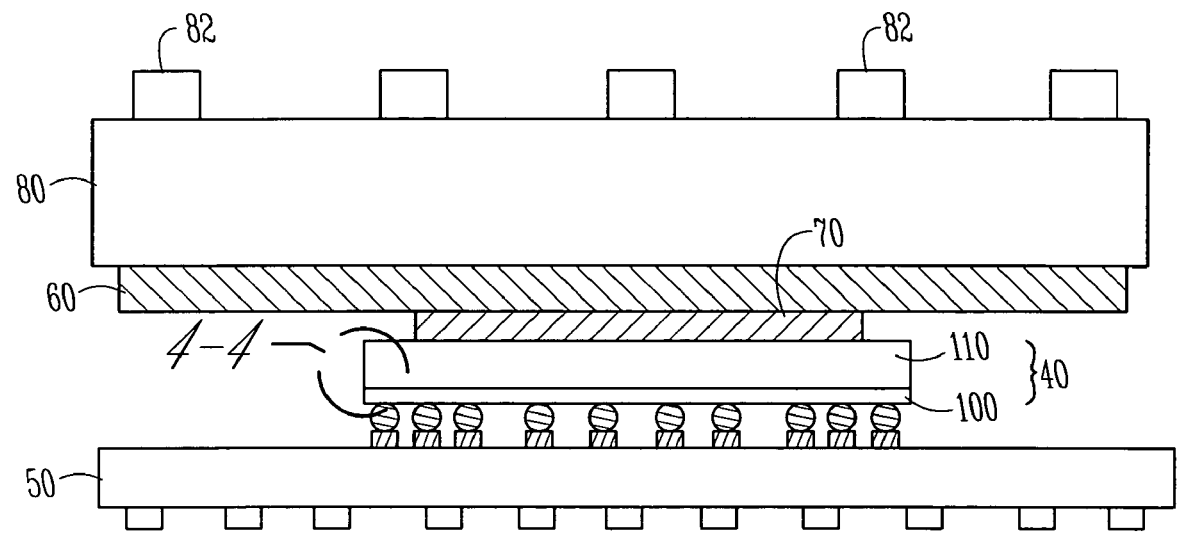
FIG. 3a is a cross-sectional representation of a first embodiment of an IC package according to the invention.
Figure 3B:
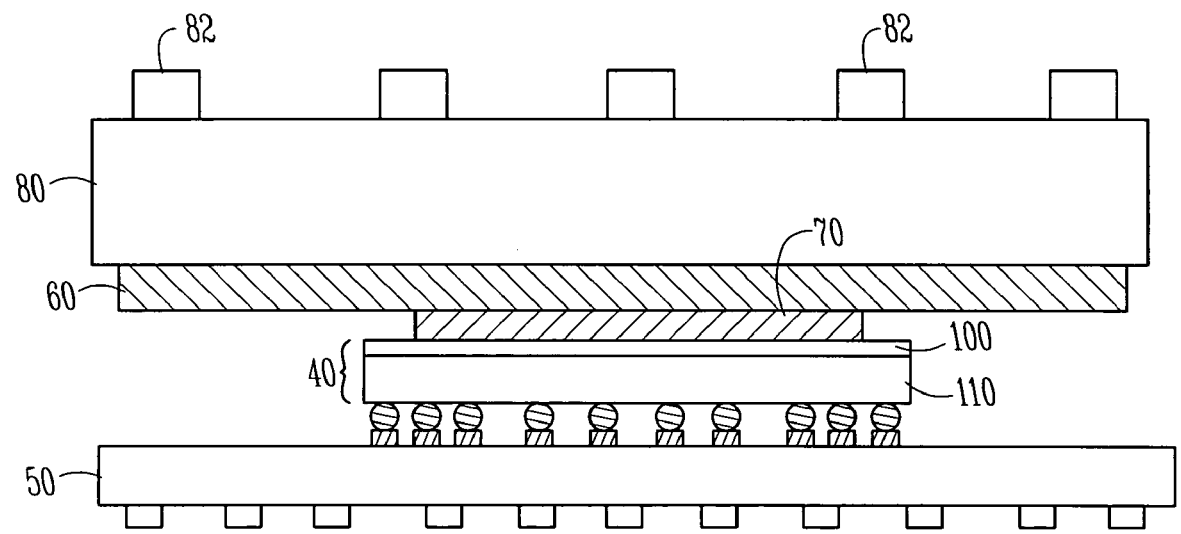
FIG. 3b is a cross-sectional representation of a second embodiment of an IC package according to the invention.
Figure 3C:
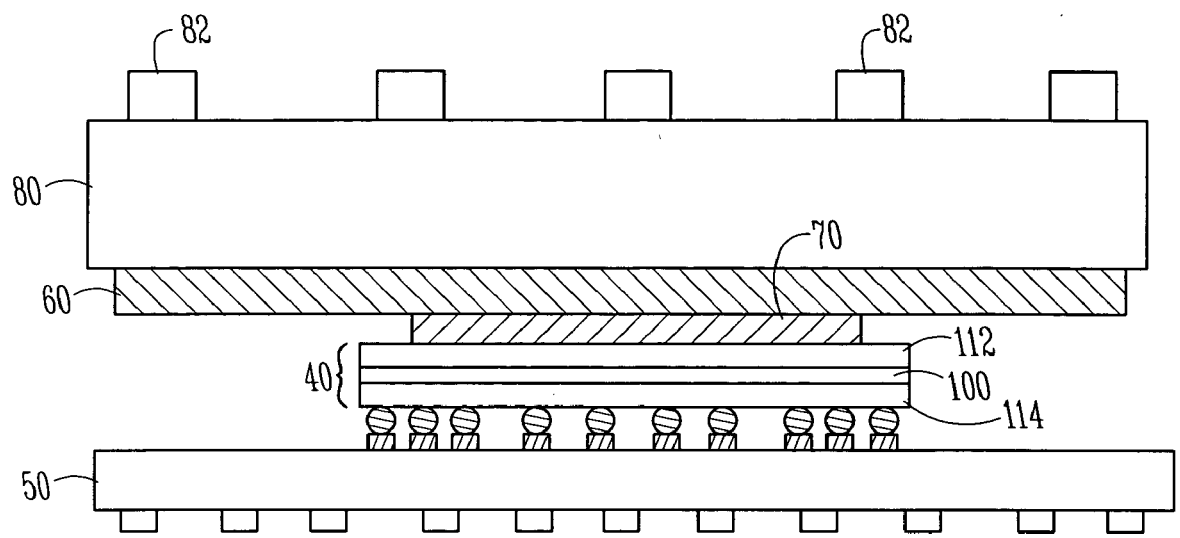
FIG. 3c is a cross-sectional representation of a third embodiment of an IC package according to the invention.

FIGS. 3a–3c show the addition of a heat spreading layer 100 formed on or within the die 40 according to the invention. The heat spreading layer is formed as an integral part of the die 40. Integrally forming the heat spreading layer entails forming the layer during the chip fabrication process. The layer effectively becomes a part of the die 40. Using this method, a thin film such as the 0.05 mm heat spreading layer 100 can be added to the die, and the die provides support for the film. If a film were added separately, instead of integral formation, it would be extremely fragile and impractical to manufacture separately. Additionally, integrally forming the heat spreading layer 100 has the advantage of a high surface contact area. Any surface features of the die are easily covered during the forming process and covering all surface areas of such features increases the speed and effectiveness of heat conduction into the heat spreading layer. Locating the heat spreading layer within the die, for example, beneath electrical devices such as transistors is also easily accomplished by integrally forming the heat spreading layer.

In FIG. 3a, the heat spreading layer 100 is formed on an active side of a semiconductor portion 110 of the die 40. In FIG. 3b, the heat spreading layer is formed on the back side of the semiconductor portion 110. In FIG. 3c, the heat spreading layer 100 is formed as an intermediate step in the formation of the die 40. In FIG. 3c, the heat spreading layer 100 divides the die 40 into a first semiconducting layer 112, and a second semiconducting layer 114. While the exact location of the heat spreading layer 100 within the die 40 is not critical, the heat spreading layer must be thermally connected to the areas of the semiconductor portion 110 that will generate the most heat. Positioning the heat spreading layer directly on the active side of the die 40 will be effective because electronic devices on the active side will be in direct contact with the heat spreading layer 100. It would also be possible to have intermediate structures or layers between the semiconductor portion 110 and the heat spreading layer 100, provided the intermediate structures were thermally conducting.

The heat spreading layer 100, in one embodiment as shown in FIGS. 3a–3c is directly deposited on or within the die 40. There are no additional layers between the heat spreading layer 100 and the semiconductor portion 110. This configuration reduces the number of interfaces that heat must conduct through along it's path to ambient. Frequently, additional interfaces between materials will slow down conduction of heat. If additional layers were used between the heat spreading layer 100 and the semiconductor portion 110, additional processing steps would also be required, which would increase manufacturing process time.

As shown in FIGS. 3a–3c, the die 40 with the heat spreading layer 100 of the invention, may be coupled to a Thermal Interface Material (TIM) 70, an external heat spreader 60, and a heat sink 80. The addition of the integral heat spreading layer serves to conduct heat away from local hot spots on the die 40 and distribute the heat across the die 40. In this manner, the heat may be conducted via a larger horizontal cross sectional area through the die 40 to the TIM 70, and eventually out to ambient.

Figure 4:
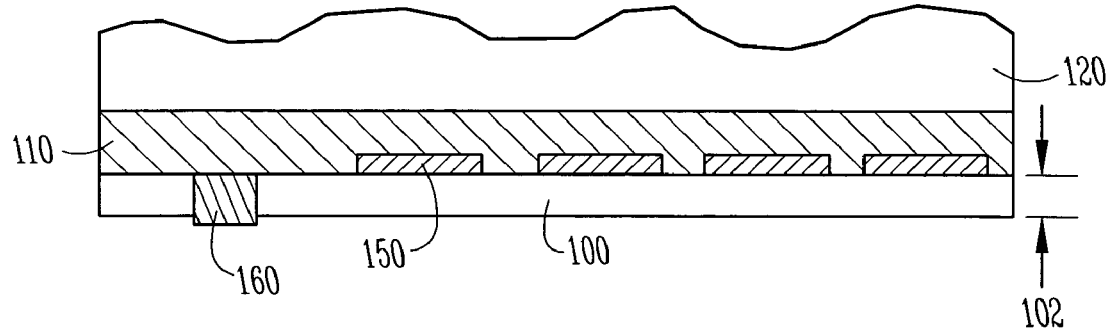

FIG. 4 shows a magnified view of the die 40 and the heat spreading layer 100 from FIG. 3a. The semiconductor layer 110 may make up a bulk substrate of the die 40, or it may only be a layer on top of another substrate 120 such as glass.

Electrical devices 150 are formed on the semiconductor layer 110. It is understood that in context, formed "on" the semiconductor layer could mean on top of, within the semiconductor layer, or partially within the semiconductor layer. It is also understood that although not shown in the figures, the electrical devices are electrically connected to each other by elements such as metal traces. Some examples of electrical devices formed in an integrated circuit die include but are not limited to transistors, diodes, and capacitors. Combinations of devices can be used to form higher level circuits. Computationally intensive logic circuits are of particular interest due to their large heat generation. Floating Point Unit (FPU) circuits or Integer units can generate large amounts of heat, as well as other heat generating circuits of varying complexity.

The heat spreading layer 100 is formed to a thickness 102 over the semiconductor layer 110, and over the electrical devices 150. An electrical connection 160 may be provided to transmit electrical signals from the electrical devices 150 to the outside of the die 40 through the heat spreading layer 100.

Although several thicknesses 102 of the heat spreading layer 100 are possible, a thickness of 0.05 mm or less is practical, in order to accommodate the height of a typical electrical connection 160. If the layer 100 is formed thinner than 0.05 mm, a tradeoffs in heat spreading is a reduced vertical cross section of material in the layer 100 to conduct the heat with. An additional consideration in choosing the thickness of the layer 100 is the process time necessary to form the layer 100. A thicker layer takes longer to form, and may become a process time limiting step. For this reason, it is advantageous to form a thin layer 100 using less process time.

Figure 5:
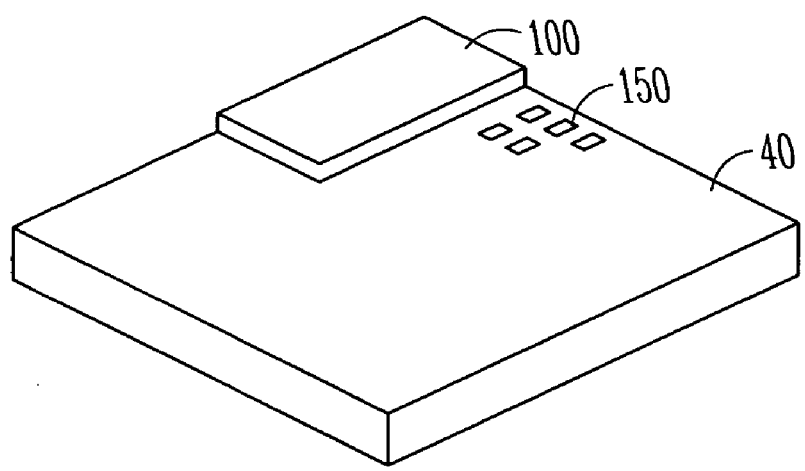
FIG. 5 is a perspective view of a die according to the invention

FIG. 5 shows a die 40 with its active side up, with a heat spreading layer 100 covering a portion of the die surface. The heat spreading layer may cover the entire surface of the die 40 in one embodiment. In another embodiment, the heat spreading layer may cover only a select portion of the surface of the die 40 as show in FIG. 5.

The material selected for the heat spreading layer in the invention must exhibit a thermal conductivity that is greater than that of the semiconductor used in the die. A metal such as copper could be used with silicon as a semiconductor, because copper has a thermal conductivity around 3 times greater than silicon. In one embodiment of the invention, the heat spreading layer contains carbon. One type of carbon layer that is well suited to performing as a heat spreading layer is diamond. Diamond has a thermal conductivity around 20 times greater than silicon, and around 6 times greater than copper. Diamond is also useful because it is readily formed through processes such as chemical vapor deposition (CVD). Although CVD is a process that is easily incorporated into the die manufacturing process line, other deposition or attachment processes could be used and still be within the scope of the invention. Other possible carbon layer configurations could include carbon 13, or variations of Buckminster fullerenes such as nanotubes.

The heat spreading layer 100 may be formed at any of several periods during the manufacturing process of the IC. One possible time for formation of the heat spreading layer would be before any electronic devices, such as transistors, were formed. Forming the heat spreading layer 100 first would allow a high temperature forming process for the heat spreading layer, without affecting any electronic devices, which may be affected by a high temperature process.

Figure 6:
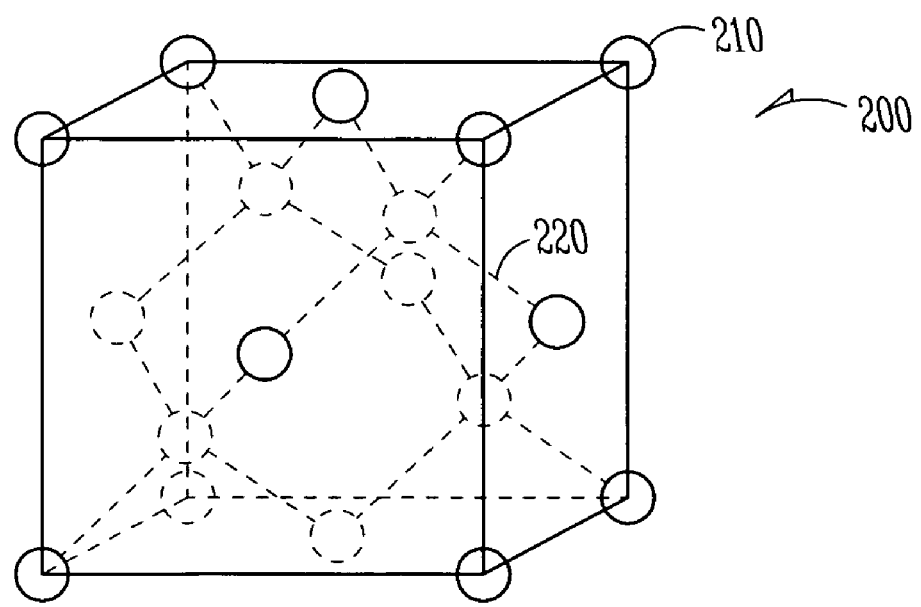
FIG. 6 is a diagram of a diamond crystal structure unit cell.

FIG. 6 illustrates a diamond crystal structure unit cell 200. The unit cell 200 is a face centered cubic (FCC) structure made up of all carbon atoms 210. The carbon atoms in the diamond unit cell 200 are bonded by SP3 bonds 220. In the practice of CVD diamond layer deposition, the resulting layer commonly contains a large fraction of diamond, but is not entirely diamond. A typical characterization of a diamond layer is a percentage of SP3 bonding within the layer. A 100% pure diamond film would contain 100% SP3 bonds. The heat spreading layer in the invention as deposited by CVD does not require 100% SP3 bonding to be effective. However, a lower percentage of SP3 bonding results in less effective thermal conduction. In order to be effective, the heat conducting film must exhibit thermal conductivity that is greater than the semiconductor layer it is coupled to.

Figure 7B:
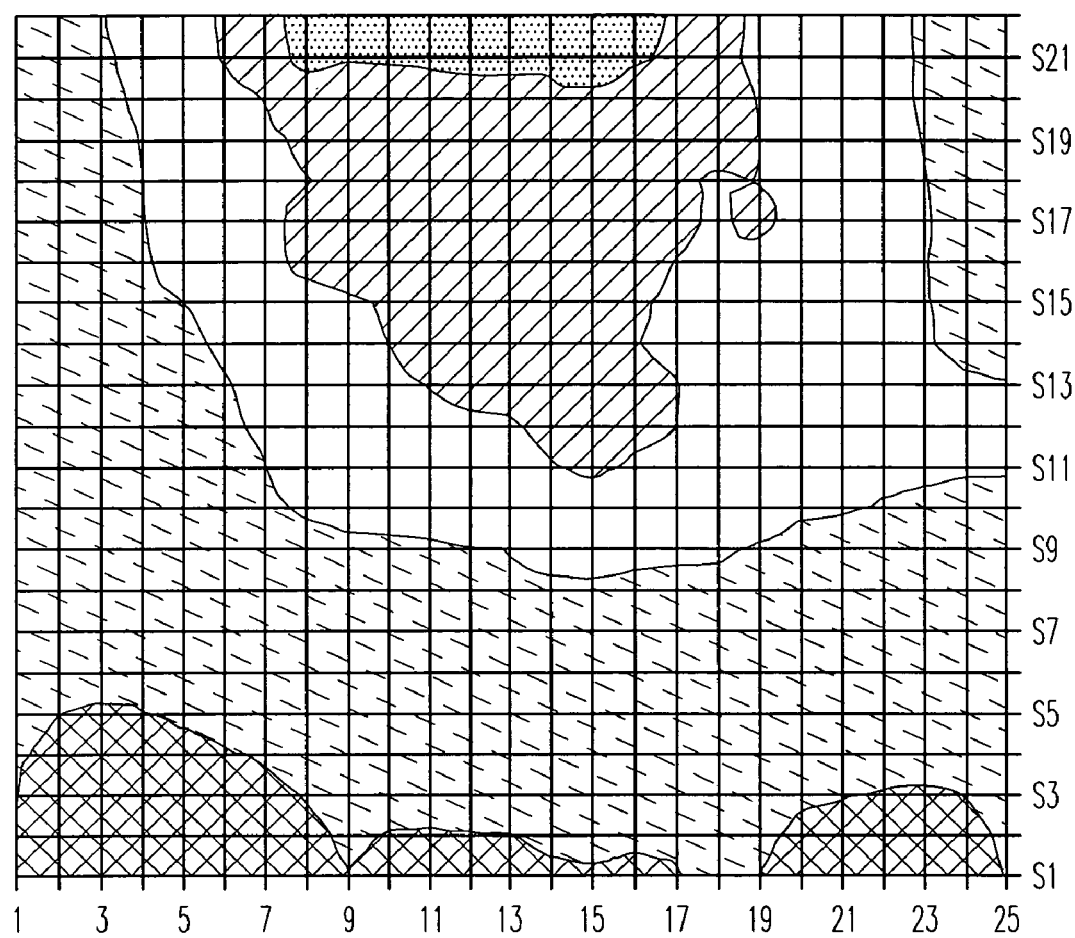
FIG. 7b is an experimental data thermal map of a semiconductor chip according to the invention.
Figure 7B:
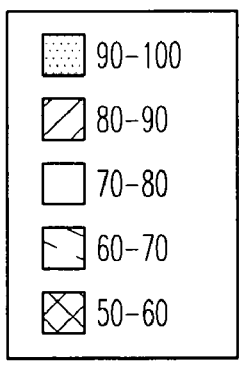

FIGS. 7a and 7b show experimental data of a number of computationally intensive logic areas on a semiconductor processor chip. A first location is at 10,S22, a second location is at 15,S22, and a third location is at 14,S15. While the results shown focus on a processor chip, other semiconductor chips could similarly benefit from the invention. FIG. 7a shows a thermal map of a semiconductor processor chip without an integral heat spreading layer. The three computationally intensive logic areas show temperatures in the 100–110 degree Celsius range, and a very concentrated thermal gradient associated with these areas. In contrast, FIG. 7b shows the same area of a semiconductor processor chip coated with a 0.05 mm layer of CVD diamond. The peak temperature is in the 90–100 degrees Celsius range, and the thermal gradient associated with the three computationally intensive logic areas is more spread out as evidenced by the larger 80–90 degree Celsius map region.

CONCLUSION

A semiconductor chip has been shown that more effectively transmits heat from hot areas on the die to cooler regions on the die, and eventually to the thermal interface material as a result of spreading the heat out over a larger cross sectional area. Local hot spots are minimized which allows the semiconductor chip to operate at a higher frequency for a given upper threshold temperature.

It is to be understood that the above description is intended to be illustrative, and not restrictive. Many other embodiments will be apparent to those of skill in the art upon reviewing the above description. The scope of the invention should, therefore, be determined with reference to the appended claims, along with the full scope of equivalents to which such claims are entitled.

We claim:

1. A method of cooling a semiconductor chip, comprising:
providing a number of electrical devices on a semiconductor layer of a flip-chip configuration semiconductor chip;
integrally forming a substantially planar heat conducting layer on only a computationally intensive portion of a backside surface of the semiconductor chip, wherein the heat conducting layer is compatible with semiconductor processing techniques, the heat conducting layer having a higher thermal conductivity than the semiconductor layer;
conducting heat generated by the number of electrical devices into the heat conducting layer;
transmitting the heat generated by the number of electrical devices through the heat conducting layer from a first region having a first temperature to a second region having a second temperature that is lower than the first region; and
transmitting heat through a substantially continuous interface between the heat conducting layer and an external heat sink.

2. The method of claim 1, wherein providing a number of electrical devices includes providing a number of transistors.

3. The method of claim 1, wherein coupling a heat conducting layer to the semiconductor layer comprises coupling a carbon containing layer to the semiconductor layer.

4. The method of claim 3 wherein coupling a carbon containing layer to the semiconductor layer comprises coupling a diamond containing layer to the semiconductor layer.

5. A method of cooling a semiconductor chip formed from a semiconducting material, comprising:
integrally coupling a substantially planar heat conducting layer to only a computationally intensive portion of a back side surface of a flip-chip configuration semiconductor chip, wherein the heat conducting layer is compatible with semiconductor processing techniques, the heat conducting layer having a higher thermal conductivity than the semiconducting material;
conducting heat from the semiconductor chip into the heat conducting layer;
transmitting the heat through the heat conducting layer from a first region having a first temperature to a second region having a second temperature that is lower than the first temperature; and
transmitting heat through a substantially continuous interface between the heat conducting layer and an external heat sink.

6. The method of claim 5, wherein coupling a substantially planar heat conducting layer to the semiconductor chip includes coupling a carbon containing layer to the semiconductor chip.

7. The method of claim 6, wherein coupling a carbon containing layer to the semiconductor chip includes coupling a diamond containing layer to the semiconductor chip.

8. A method of cooling a semiconductor chip, comprising:
integrally forming a diamond containing layer on only a computationally intensive portion of a backside of a flip-chip configuration semiconductor chip, the chip including a number of electrical devices;
conducting heat generated by at least a portion of the number of electrical devices in a first area into the diamond containing layer;
spreading the heat generated by the electrical devices in the first area through the diamond containing layer to a larger second area wherein heat per unit area is reduced; and
transmitting heat through a substantially continuous interface between the diamond containing layer and an external heat sink.

9. The method of claim 8, wherein integrally forming a diamond containing layer adjacent to a number of electrical devices includes integrally forming a diamond containing layer adjacent to a number of transistors.

10. The method of claim 8, wherein integrally forming a diamond containing layer adjacent to a number of electrical devices includes integrally forming a diamond containing layer on a back side of the semiconductor chip.

11. A method of manufacturing a semiconductor chip, comprising:
fabricating a semiconductor layer in a flip-chip configuration semiconductor chip;
forming a number of electrical devices on the semiconductor layer;
electrically connecting the number of electrical devices;
integrally forming a substantially planar heat conducting layer on only a computationally intensive portion of a backside surface of the flip-chip configuration semiconductor chip, wherein the heat conducting layer is compatible with semiconductor processing techniques, the heat conducting layer having a higher thermal conductivity than the semiconductor layer; and
coupling an external heat sink to the heat conducting layer to form a substantially continuous interface.

12. The method of claim 11, wherein fabricating a semiconductor layer includes fabricating a silicon substrate.

13. The method of claim 11, wherein forming a substantially planar heat conducting layer includes forming a carbon containing layer.

14. The method of claim 13, wherein forming a carbon containing layer includes forming a diamond containing layer.

15. The method of claim 14, wherein forming a diamond containing layer includes chemical vapor deposition (CVD) depositing a diamond layer.

16. A method of manufacturing a semiconductor chip, comprising:
    forming a number of transistors on a semiconductor layer in a flip-chip configuration semiconductor chip;
    electrically connecting the number of transistors; and
    integrally forming a substantially planar diamond containing layer on only a computationally intensive portion of a backside surface of the flip-chip configuration semiconductor chip, and adjacent to the number of transistors; and
    coupling an external heat sink to the diamond containing layer to form a substantially continuous interface.

17. The method of claim 16, wherein forming a number of transistors on a semiconductor layer includes forming a number of transistors on a silicon substrate.

18. The method of claim 16, wherein integrally forming a substantially planar diamond containing layer includes chemical vapor depositing a substantially planar diamond containing layer. adjacent to the number of transistors includes integrally forming a substantially planar diamond containing layer on a back side of the semiconductor chip.

19. A method of forming an electronic system, comprising:
    forming a flip-chip processor chip, including:
        forming a number of transistors on a semiconductor layer;
        electrically connecting the number of transistors;
        integrally forming a substantially planar diamond containing layer on only a computationally intensive portion of a backside surface of the flip-chip processor chip;
    coupling an external heat sink to the diamond containing layer to form a substantially continuous interface; and
    coupling the flip-chip processor chip to a random access memory.

20. The method of claim 19, wherein forming a substantially planar diamond containing layer includes chemical vapor deposition (CVD) depositing a diamond layer.

* * * * *

UNITED STATES PATENT AND TRADEMARK OFFICE
CERTIFICATE OF CORRECTION

PATENT NO. : 7,132,313 B2  Page 1 of 1
APPLICATION NO. : 10/721722
DATED : November 7, 2006
INVENTOR(S) : O'Connor et al.

It is certified that error appears in the above-identified patent and that said Letters Patent is hereby corrected as shown below:

In column 8, line 50, in Claim 10, delete "integrally forming" and insert -- chemical vapor depositing --, therefor.

In column 10, line 4, in Claim 18, after "layer." delete "adjacent to the number of transistors includes integrally forming a substantially planar diamond containing layer on a back side of the semiconductor chip.".

Signed and Sealed this

Twenty-third Day of February, 2010

David J. Kappos
*Director of the United States Patent and Trademark Office*